United States Patent
Miller et al.

(10) Patent No.: US 9,150,758 B2
(45) Date of Patent: Oct. 6, 2015

(54) POLISHING COMPOSITION, POLISHING METHOD USING SAME, AND METHOD FOR PRODUCING SEMICONDUCTOR DEVICE

(75) Inventors: Anne Miller, Tualatin, OR (US); Chiaki Saito, Kiyosu (JP); Kanako Fukuda, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/007,272

(22) PCT Filed: Mar. 28, 2012

(86) PCT No.: PCT/JP2012/058258
§ 371 (c)(1),
(2), (4) Date: Dec. 19, 2013

(87) PCT Pub. No.: WO2012/133591
PCT Pub. Date: Oct. 4, 2012

(65) Prior Publication Data
US 2014/0141612 A1     May 22, 2014

Related U.S. Application Data

(60) Provisional application No. 61/469,354, filed on Mar. 30, 2011.

(51) Int. Cl.

| | | |
|---|---|---|
| H01L 21/302 | (2006.01) |
| H01L 21/461 | (2006.01) |
| B44C 1/22 | (2006.01) |
| C23F 1/00 | (2006.01) |
| C03C 15/00 | (2006.01) |
| C03C 25/68 | (2006.01) |
| C09G 1/02 | (2006.01) |
| H01L 21/304 | (2006.01) |
| H01L 21/321 | (2006.01) |
| B24B 37/04 | (2012.01) |
| C09K 3/14 | (2006.01) |
| H01L 21/306 | (2006.01) |
| H01L 21/768 | (2006.01) |
| C09G 1/00 | (2006.01) |
| C09G 1/04 | (2006.01) |

(52) U.S. Cl.
CPC ............... *C09G 1/02* (2013.01); *B24B 37/044* (2013.01); *C09K 3/1409* (2013.01); *C09K 3/1463* (2013.01); *H01L 21/304* (2013.01); *H01L 21/30625* (2013.01); *H01L 21/3212* (2013.01); *H01L 21/461* (2013.01); *H01L 21/7684* (2013.01); *C09G 1/00* (2013.01); *C09G 1/04* (2013.01)

(58) Field of Classification Search
None
See application file for complete search history.

(56) References Cited

U.S. PATENT DOCUMENTS

| | | | |
|---|---|---|---|
| 4,828,795 A * | 5/1989 | Cook et al. ................. 422/15 |
| 6,315,803 B1 * | 11/2001 | Ina et al. ................... 51/307 |
| 6,852,632 B2 | 2/2005 | Wang et al. |
| 6,855,266 B1 | 2/2005 | Wang et al. |
| 2002/0194789 A1 | 12/2002 | Oshima |
| 2003/0153184 A1 | 8/2003 | Wang et al. |
| 2003/0170991 A1 | 9/2003 | Wang et al. |
| 2009/0101864 A1 | 4/2009 | Song et al. |
| 2010/0176335 A1 | 7/2010 | Kim et al. |
| 2011/0230053 A1 | 9/2011 | Matsuda et al. |

FOREIGN PATENT DOCUMENTS

| | | |
|---|---|---|
| CN | 101418189 A | 4/2009 |
| EP | 2 234 145 A1 | 9/2010 |
| JP | 2001-089747 A | 4/2001 |
| JP | 2003-507895 | 2/2003 |
| JP | 2004-231748 A | 8/2004 |
| JP | 2005-217360 A | 8/2005 |
| JP | 2005-220365 A | 8/2005 |
| JP | 2008-300858 A | 12/2008 |
| JP | 2009-054796 | * 3/2009 |
| JP | 2009-054796 A | 3/2009 |
| JP | 2009-514196 A | 4/2009 |
| JP | 2010-529672 A | 8/2010 |
| WO | WO 01/12740 A1 | 2/2001 |

* cited by examiner

Primary Examiner — Stephanie Duclair
(74) Attorney, Agent, or Firm — Foley & Lardner LLP

(57) ABSTRACT

The polishing composition of the present invention contains an oxidizing agent and a scratch-reducing agent represented by general formula (1) or (2) below.

$$X_1 - \underset{\underset{X_2}{|}}{\overset{\overset{OH}{|}}{C}} - PO_3^{2-} \quad (1)$$

$$O_3P^{2-} \diagdown \underset{X_1}{\diagup} NCH_2CH_2N \diagdown \underset{X_2}{\diagup} PO_3^{2-} \quad (2)$$

In the formulas, $X_1$ and $X_2$ are each independently a hydrogen atom, a hydroxyl group, a carboxyl group, a phosphate group, an alkyl group, an aryl group, an alkyl polyamine group, an alkyl polyphosphate group, an alkyl polycarboxylate group, an alkyl polyaminopolyphosphate group, or an alkyl polyaminopolycarboxylate group.

9 Claims, No Drawings

POLISHING COMPOSITION, POLISHING METHOD USING SAME, AND METHOD FOR PRODUCING SEMICONDUCTOR DEVICE

TECHNICAL FIELD

The present invention relates to a polishing composition used in polishing, for example, for forming the wiring of a semiconductor device, and to a polishing method using the composition.

BACKGROUND ART

When the wiring of a semiconductor device is formed, first a barrier layer and a conductor layer are successively formed on an insulator layer having trenches. Then, at least portion of the conductor layer located outside of the trenches (outside portion of the conductor layer) and portion of the barrier layer located outside of the trenches (outside portion of the barrier layer) are removed by chemical mechanical polishing. Such polishing to remove at least the outside portion of the conductor layer and the outside portion of the barrier layer is generally carried out as two steps: a first polishing step and a second polishing step. In the first polishing step, part of the outside portion of the conductor layer is removed to expose the upper surface of the barrier layer. Removal of part of the outside portion of the conductor layer is generally begun at what is initially a relatively high polishing removal rate, after which the polishing removal rate is held down in order to minimize the formation of steps between the upper surface of the conductor layer and the upper surface of the barrier layer. In the subsequent second polishing step, at least the remainder of the outside portion of the conductor layer and the outside portion of the barrier layer (in some cases, part of the insulator layer as well) are removed in order to expose the insulator layer and obtain a flat surface. Conductor wiring composed of the portions of the conductor layer remaining within the trenches is thereby obtained.

In such polishing for the purpose of forming the wiring of a semiconductor device, particularly polishing in the second polishing step, use is generally made of a polishing composition that includes both a polishing accelerator such as an acid and an oxidizing agent and further includes, where necessary, polishing abrasive grains. It has been proposed that an organic acid and a surfactant be added to a polishing composition to increase the polishing removal rate and reduce defects in an object to be polished after polishing. For example, Patent Document 1 discloses a polishing composition containing two types of abrasive grains of different sizes, a triazole compound, and an organic acid such as PBTC, and attempts both to increase the barrier layer polishing removal rate and to suppress defects such as surface contamination. Patent Document 2 discloses a polishing composition containing a metal oxide dissolving agent, abrasive grains, and a surfactant such as HEDP that keeps the abrasive grains from precipitating. The aim of using a surfactant that keeps the abrasive grains from precipitating is both to increase the ease of cleaning an object to be polished and to reduce the adhesion of foreign matter to the object to be polished. Patent Document 3 discloses a polishing composition containing an oxidizing agent and a specific compound of HEDP or NTMP. The prime aim of using the specific compound is to form a metal protective film on an object to be polished composed of copper or silver to reduce defects such as corrosion on the object to be polished.

However, when the wiring of a semiconductor device is formed by chemical mechanical polishing, scratches commonly appear on the conductor wiring. Reducing such scratches to a satisfactory level with the polishing compositions disclosed in Patent Documents 1-3 is difficult.

One cause of scratches on conductor wiring is thought to be aggregation of abrasive grains in a polishing composition. Means that have been adopted for reducing such scratching include, for example, removing coarse abrasive grains from the polishing composition, preventing abrasive grains aggregation within the composition, and adding a chemical substance having the effect of forming a protective film on the surface of the conductor layer. However, such means do not sufficiently reduce scratching.

In another means for reducing scratching, a new problem sometimes arises. Specifically, portions of a conductor layer that are located in trenches and are not supposed to be removed end up being removed by polishing more rapidly than an insulator layer, which results in the increase of the size of steps between the upper surface of the conductor wiring and the upper surface of the insulator layer.

PRIOR ART DOCUMENTS

Patent Document 1: Japanese National Phase Laid-Open Patent Publication No. 2009-514196
Patent Document 2: Japanese Laid-Open Patent Publication No. 2005-217360
Patent Document 3: Japanese Laid-Open Patent Publication No. 2008-300858

SUMMARY OF THE INVENTION

Problems that the Invention is to Solve

Accordingly, it is an objective of the present invention to provide a polishing composition that can be suitably used to obtain semiconductor devices in which scratches on the conductor wiring has been reduced without much of an increase in the size of steps between the upper surface of the conductor wiring and the upper surface of the insulator layer. It is a further objective of the invention to provide a polishing method that uses such a polishing composition, and to provide a method for manufacturing a semiconductor device using such a polishing composition.

Means for Solving the Problems

To achieve the foregoing objectives and in accordance with a first aspect of the present invention, a polishing composition is provided that contains an oxidizing agent and a scratch-reducing agent represented by general formula (1) or (2) below.

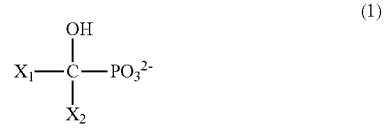

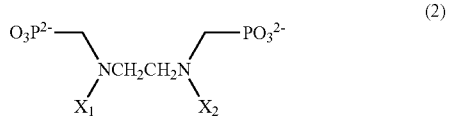

In the general formulas (1) and (2), $X_1$ and $X_2$ are each independently a hydrogen atom, a hydroxyl group, a carboxyl group, a phosphate group, an alkyl group, an aryl group, an alkyl polyamine group, an alkyl polyphosphate group, an alkyl polycarboxylate group, an alkyl polyaminopolyphosphate group, or an alkyl polyaminopolycarboxylate group.

In accordance with a second aspect of the present invention, a polishing method is provided that includes polishing a surface of an object to be polished that has copper or a copper alloy on at least a portion thereof with the polishing composition according to the first aspect.

In accordance with a third aspect, a method of manufacturing a semiconductor device is provided that includes polishing a surface of an object to be polished that has copper or a copper alloy on at least a portion thereof with the polishing composition according to the first aspect in order to obtain the semiconductor device.

MODES FOR CARRYING OUT THE INVENTION

One embodiment of the present invention will now be described below.

A polishing composition of the present embodiment is prepared by mixing an oxidizing agent, a scratch-reducing agent, and preferably also abrasive grains and a polishing accelerator, in water. Therefore, the polishing composition contains an oxidizing agent and a scratch-reducing agent, and preferably also contains abrasive grains and a polishing accelerator.

The polishing composition of the present embodiment is intended for use primarily in polishing to form the wiring of a semiconductor device as described above, and more specifically in polishing in the second polishing step. Examples of the insulator layer material include, but not particularly limited to, silicon oxide such as silicon oxide, fluorine-containing silicon oxide, boron-containing silicon oxide, carbon-containing silicon oxide, SiH-containing silicon oxide, porous silicon oxide, methyl group-containing silicon oxide, and porous methyl group-containing silicon oxide; polymeric material such as polyimide polymers, parylene polymers, teflon polymers, and other copolymeric polymers; and amorphous carbon. Of these, silicon oxide insulator layers are preferred, and silicon oxide, fluorine-containing silicon oxide, boron-containing silicon oxide, and carbon-containing silicon oxide are particularly preferred. The conductor layer is composed of copper or a copper alloy. Examples of the barrier layer material include, but are not particularly limited to, tantalum, tantalum nitride, and other tantalum alloys; titanium, titanium nitride, and other titanium alloys; and tungsten, tungsten nitride, and other tungsten alloys. Of these, tantalum, tantalum nitride, titanium, titanium nitride, tungsten, and tungsten nitride are preferred, and tantalum and tantalum nitride are particularly preferred.

(Oxidizing Agent)

The oxidizing agent contained in the polishing composition acts to oxidize the surface of the object to be polished, and in particular to oxidize the surface of the barrier layer and the conductor layer, thereby increasing the polishing removal rate with the polishing composition.

The oxidizing agent used may be, for example, a peroxide. Examples of peroxides include hydrogen peroxide, peracetic acid, percarbonate, urea peroxide, and perchloric acid, and also persulfates such as sodium persulfate, potassium persulfate, and ammonium persulfate. Of these, hydrogen peroxide and persulfates are preferred from the standpoint of the polishing removal rate, and hydrogen peroxide is particularly preferred from the standpoint of improved stability in aqueous solutions and reduced impact on the environment.

The content of the oxidizing agent in the polishing composition is preferably no less than 0.1 g/L, more preferably no less than 0.5 g/L, and further preferably no less than 1 g/L. As the content of the oxidizing agent becomes higher, the polishing removal rate with the polishing composition rises.

The content of the oxidizing agent in the polishing composition is preferably 200 g/L or less, more preferably 100 g/L or less, and further preferably 50 g/L or less. As the content of the oxidizing agent becomes lower, the material costs of the polishing composition can be reduced, in addition to which the burden of treating the polishing composition following use in polishing, i.e., the burden of waste liquid treatment, can be reduced. Moreover, it is also possible in this way to lower the risk of excessive oxidation of the surface of the object to be polished, particularly excessive oxidation of the conductor layer, by the oxidizing agent.

(Scratch-Reducing Agent)

Scratches on conductor wiring are thought to be caused by the aggregation of abrasive grains in the polishing composition, and also by insoluble copper compounds such as copper oxide and copper hydroxide, which form from copper or copper alloy that has been leached from the conductor layer by the effect of the oxidizing agent. Because these copper compounds have a higher hardness than the copper or copper alloy of the conductor wiring, scratches readily form on the conductor wiring due to collisions of the copper compounds with the conductor wiring. For example, in terms of the Mohs hardness scale, cuprous oxide has a hardness of 3.5 to 4, cupric oxide has a hardness of about 4.5, and cupric hydroxide has a hardness of 3.5 to 4, whereas copper itself has a hardness of 2.5 to 3.

The scratch-reducing agent contained in the polishing composition of the present embodiment causes copper compounds such as copper oxide and copper hydroxide to dissolve in the polishing composition, and thereby reduces scratching of the conductor wiring. Moreover, because the scratch-reducing agent acts to selectively dissolve copper compounds such as copper oxide and copper hydroxide rather than the copper or copper alloy of the conductor wiring, it does not make the steps between the upper surface of the conductor wiring and the upper surface of the insulator layer much larger than the steps upon completion of the first polishing step. Furthermore, there is a risk that copper compounds such as copper oxide and copper hydroxide will serve as nuclei when the abrasive grains aggregate, and the scratch-reducing agent also has the effect of reducing scratches caused by such aggregation of the abrasive grains.

The scratch-reducing agent used is a compound represented by general formula (1) or (2) below.

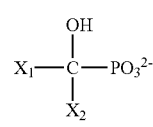

(1)

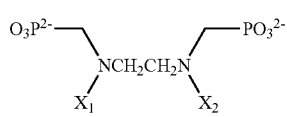

(2)

In general formulas (1) and (2), $X_1$ and $X_2$ are each independently a hydrogen atom, a hydroxyl group, a carboxyl group, a phosphate group, an alkyl group, an aryl group, an alkyl polyamine group, an alkyl polyphosphate group, an alkyl polycarboxylate group, an alkyl polyaminopolyphosphate group, or an alkyl polyaminopolycarboxylate group.

Examples of the compound represented by general formula (1) include hydroxyphosphonocarboxylic acid, (((2-hydroxyethyl)(2-((phosphonomethyl)amino)ethyl)amino)methyl)phosphonic acid, ethylenediamine-N,N'-bis(acetic acid)-N,N'-bis(methylene phosphonic acid), (((2-(((bis(hydroxymethyl)phosphino)methyl)(phosphonatomethyl)amino)ethyl)imino)bis(methylene))bisphosphonate, diethylenetriamine penta(methylene phosphonic acid), diethylenetriamine tri(methylene phosphonic acid), (ethane-1,2-diylbis(imino((2-hydroxyphenyl)methylene)))bisphosphonic acid, diethylenetriamine penta(methylene phosphonic acid), (ethane-1,2-diylbis((3-(bis(phosphonomethyl(amino)propyl)imino)bis(methylene))bisphosphonic acid, and [ethane-1,2-diylbis(iminopropane-2,2-diyl)]bisphosphonic acid.

Examples of the compound represented by general formula (2) include ethylenediamine tetrakismethylenephosphonic acid, hydroxyethylidene diphosphonic acid, methane hydroxydiphosphonic acid, 2-hydroxy-2-phosphonopropionic acid, pamidronic acid, alendronic acid, (1,6-dihydroxy-1,6-hexanediylidene)tetrakisphosphonic acid, 1-hydroxypropane-1,1-diphosphonic acid, 1-hydroxybutane-1,1-diphosphonic acid, 4-N,N-dimethylamino-1-hydroxybutylidene-1,1-diphosphonic acid, diglycidyl-(3-(3,3-bisphosphono-3-hydroxypropylamino)-2-hydroxypropyl)urazol, 4-(4-(bis(2-chloroethyl)amino)phenyl)-1-hydroxybutane-1,1-bisphosphonic acid, (1-hydroxy-3-(3-pyridinyl)propylidene)bisphosphonic acid, (1-hydroxy-2-(imidazo(1,2-A)-pyridin-3-yl(ethylidene)bisphosphonic acid, ((3-(bis(2-chloroethyl)amino)-4-methylphenyl)hydroxymethylene)bisphosphonic acid, N-[methyl(4-phenylpropyl)]-3-aminopropyl-1-hydroxy-1,1-bisphosphonic acid phosphonate, N-(4-phenylbutyl)-3-aminopropyl-1-hydroxy-1,1-bisphophonic acid, N-[methyl(4-phenylbutyl)]-3-aminopropyl-1-hydroxy-1,1-bisphosphonic acid, [1-hydroxy-3-[methyl(2-phenoxyethyl)amino]propylidene-1,1-bisphosphonic acid, 1-hydroxy-3-aminopropane-1,1-diphosphonate-gd-dtpa, N-[methyl(4-phenylethyl)]-3-aminopropyl-1-hydroxy-1,1-bisphosphonic acid, 1-hydroxy-3-[methyl(pentyl)amino]-1-phosphonopropylphosphonic acid, ibandronate, tetrapivaloyloxymethy 1-1-(4-hydroxyphenoxy)ethane-1,1-bisphosphonate, 2-(N-methyl-3-pyridinyl)-1-hydroxyethylidene bisphosphonic acid, (1-hydroxy-2-(1H-imidazol-1-yl)ethylidene)bisphosphonic acid, 2-(4-aminophenyl)-1-hydroxyethane-1,1-bisphosphonic acid, octadecyl-1-hydroxy-1,1-bisphosphonic acid, 1-hydroxybutane-1,1-bisphosphonic acid, 3-(3-pyridyl)-1-hydroxypropane-1,1-bisphosphonic acid, 2-(2-pyridyl)-1-hydroxyethane-1,1-bisphosphonic acid, 2-(4-pyridylthio)-1-hydroxyethane-1,1-bisphosphonic acid, zoledronic acid, risedronic acid, neridronic acid, 5-aminopentane-1-hydroxy-1,1-bisphosphonic acid, didecylammonium bisphosphonic acid, N-(3-hydroxy-3,3-diphosphonopropyl)-N,N,N',N',N'-pentamethylethane-1,2-diaminium, N-(3-hydroxy-3,3-diphosphonopropyl)-N,N,N',N',N'-pentamethylhexane-1,2-diaminium, N-(8-hydroxy-8,8-diphosphonooctyl)-N,N,N',N',N'-pentamethylethane-1,2-diaminium, triethylene glycol bisphosphonic acid, tetraethylene glycol bisphosphonic acid, pentaethylene glycol bisphosphonic acid, PEG(350) bisphosphonic acid, (4-acetylamino)-1-hydroxybutylidene-1,1-bisphosphonic acid, 4-hydroxy-N,N,N-trimethyl-4,4-diphosphonobutane-1-aminium, 8-hydroxy-N,N,N-trimethyl-8,8-diphosphonooctane-1-aminium, hydrogenated 2-(1,2-dihydropyridin-3-yl)-1-hydroxy-1-(hydroxyphosphinate)ethylphosphonic acid, 1-hydroxyisobutylidene diphosphonic acid, and minodronic acid.

Of these, ethylenediamine tetrakismethylenephosphonic acid, hydroxyethylidene diphosphonic acid, methane hydroxy diphosphonic acid, 2-hydroxy-2-phosphonopropionic acid, pamidronic acid, alendronic acid, (1,6-dihydroxy-1,6-hexanediylidene)tetrakisphosphonic acid, 1-hydroxypropane-1,1-diphosphonic acid, hydroxyphosphonocarboxylic acid, (((2-hydroxyethyl)(2-((phosphonomethyl)amino)ethyl)amino)methyl)phosphonic acid, ethylenediamine-N,N'-bis(acetic acid)-N,N'-bis(methylene phosphonic acid), (((2-(((bis(hydroxymethyl)phosphino)methyl)(phosphonatomethyl)amino)ethyl)imino)bis(methylene))bisphosphonate, diethylenetriamine penta(methylene phosphonic acid), and diethylenetriamine tri(methylene phosphoric acid) are preferred, and ethylenediamine tetrakismethylenephosphonic acid, hydroxyethylidene diphosphonic acid, and hydroxyphosphonocarboxylic acid are particularly preferred.

Typically, the content of the scratch-reducing agent in the polishing composition is preferably no less than 0.001 mmol/L, more preferably no less than 0.01 mmol/L, and further preferably no less than 0.1 mmol/L. As the content of the scratch-reducing agent becomes higher, scratching of the conductor wiring decreases.

The content of the scratch-reducing agent in the polishing composition is preferably 10 mmol/L or less, more preferably 5 mmol/L or less, and further preferably 3 mmol/L or less. As the content of the scratch-reducing agent becomes lower, the material costs of the polishing composition can be reduced, in addition to which the formation of steps between the upper surface of the conductor wiring and the upper surface of the insulator layer can be better suppressed.

(Abrasive Grains)

The abrasive grains, which are optionally contained in the polishing composition, act to mechanically polish the object to be polished, and are used for the purpose of increasing the polishing removal rate with the polishing composition, particularly the polishing removal rate of the barrier layer and the insulator layer.

The abrasive grains used may be inorganic particles, organic particles, or organic-inorganic composite particles. Examples of inorganic particles include particles composed of a metal oxide such as silica, alumina, ceria, or titania; and silicon nitride particles, silicon carbide particles, and boron nitride particles. Examples of organic particles include poly(methyl methacrylate) (PMMA) particles. Of the above, silica is preferred, and from the standpoint of scratch reduction and the polishing removal rate, colloidal silica is particularly preferred.

The content of the abrasive grains in the polishing composition is preferably no less than 0.005% by mass, more preferably no less than 0.5% by mass, and further preferably no less than 1% by mass. As the abrasive grains content becomes higher, the polishing removal rate with the polishing composition rises.

The content of the abrasive grains in the polishing composition is preferably 10% by mass or less, more preferably 8% by mass or less, and further preferably 5% by mass or less. As the abrasive grains content becomes lower, the material costs of the polishing composition can be reduced, in addition to which the formation of steps between the upper surface of the conductor wiring and the upper surface of the insulator layer can be better suppressed.

The average primary particle size of the abrasive grains is preferably no less than 5 nm, more preferably no less than 7 nm, and further preferably no less than 10 nm. As the average primary particle size of the abrasive grains becomes larger, the polishing removal rate with the polishing composition rises.

The average primary particle size of the abrasive grains is preferably 100 nm or less, more preferably 60 nm or less, and further preferably 40 nm or less. In general, the conductive layer is more readily removed by polishing than the insulator layer, as a result of which, owing to residual abrasive grains remaining on the conductor layer, steps about the size of the abrasive grains may form between the upper surface of the conductor wiring and the upper surface of the insulator layer. For this reason, as the average primary particle size of the abrasive grains becomes smaller, the formation of steps between the upper surface of the conductor wiring and the upper surface of the insulator layer can be better suppressed. Based on, for example, the specific surface area of the abrasive grains measured by the BET method, the average primary particle size of the abrasive grains is calculated from the formula: average primary particle size (nm)=constant/specific surface area ($m^2$/g). In the case where the abrasive grains are of a silica such as colloidal silica, the above constant is 2,121.

(Polishing Accelerator)

The polishing accelerator, which is optionally contained in the polishing composition, is used for the purpose of increasing the polishing removal rate of the barrier layer. The polishing accelerator used may be either an inorganic acid or an organic acid.

Examples of inorganic acids include sulfuric acid, nitric acid, boric acid, carbonic acid, hypophosphorous acid, phosphorous acid, and phosphoric acid.

Examples of organic acids include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid; and organic sulfuric acids such as methanesulfonic acid, ethanesulfonic acid, and isethionic acid.

A salt, such as an ammonium salt and an alkali metal salt, of an inorganic acid or an organic acid may be used, either instead of an organic acid or inorganic acid or in combination with an inorganic acid or organic acid. In the cases where a weak acid is used in combination with a strong base, a strong acid is used in combination with a weak base, or a weak acid is used in combination with a weak base, a pH buffering action is expected.

Of the above, owing to the high effectiveness in increasing the polishing removal rate of the barrier layer, preferred polishing accelerators include malic acid, tartaric acid, citric acid, glycolic acid, organic sulfuric acids, and ammonium salts or alkali metal salts thereof. Owing to the low etching solubility of the conductor layer, organic sulfuric acids and ammonium salts or alkali metal salts thereof are more preferred, and isethionic acid and ammonium salts or alkali metal salts thereof are most preferred.

The content of the polishing accelerator in the polishing composition is preferably no less than 0.01 g/L, more preferably no less than 0.1 g/L, and further preferably no less than 1 g/L. As the polishing accelerator content becomes higher, the polishing removal rate with the polishing composition rises.

The content of the polishing accelerator in the polishing composition is preferably 50 g/L or less, more preferably 30 g/L or less, and further preferably 15 g/L or less. As the content of the polishing accelerator becomes lower, the risk of excessive etching of the surface of the object to be polished by the polishing accelerator is lowered.

(pH of the Polishing Composition)

The pH of the polishing composition, as measured in a 25° C. environment, is preferably no less than 7, more preferably no less than 8, and further preferably no less than 9. As the pH of the polishing composition becomes larger, the polishing removal rate of the barrier layer and the insulator layer with the polishing composition rises.

The pH of the polishing composition, as measured in a 25° C. environment, is preferably 12 or less, more preferably 11 or less, and further preferably 10 or less. As the pH of the polishing composition becomes lower, dissolution of the abrasive grains in the polishing composition can be suppressed. In addition, as the pH of the polishing composition becomes lower, removal of the portions of the conductor layer that are located in the trenches and are not supposed to be removed by polishing can be suppressed.

Optional use may be made of alkalis, acids, and buffering agents in order to achieve the desired pH.

The present embodiment provides the following advantages.

The polishing composition of the present embodiment contains an oxidizing agent and a scratch-reducing agent. Insoluble copper compounds such as copper oxides and copper hydroxides, which arise from copper or copper alloy that has been leached from the conductor layer by the oxidizing agent, are dissolved in the polishing composition under the action of the scratch-reducing agent, thereby reducing scratching of the conductor wiring. Generally, when a compound for dissolving such insoluble copper compounds in the polishing composition is used, the portions of the conductor layer that are located in the trenches and are not supposed to be removed is removed by polishing more rapidly than the insulator layer, as a result of which the steps between the upper surface of the conductor wiring and the upper surface of the insulator layer may increase considerably in size. In contrast, when the polishing composition of the present embodiment is used, such an increase in the size of the steps is unlikely to occur. The reason appears to be that the scratch-reducing agent used in the present embodiment selectively dissolves copper compounds such as copper oxide and copper hydroxide rather than the copper or copper alloy of the conductor wiring. Moreover, the scratch-reducing agent suppresses the aggregation of abrasive grains about copper compounds such as copper oxide and copper hydroxide as nuclei. Therefore, the polishing composition of the present embodiment can be suitably used to obtain semiconductor devices in which scratches on the conductor wiring has been reduced without much of an increase in the size of steps between the upper surface of the conductor wiring and the upper surface of the insulator layer.

The above embodiment may be modified as follows.

The polishing composition of the embodiment may include two or more oxidizing agents.

The polishing composition of the embodiment may include two or more scratch-reducing agents.

The polishing composition of the embodiment may include two or more types of abrasive grains.

The polishing composition of the embodiment may include two or more polishing accelerators.

Where necessary, the polishing composition of the embodiment may further contain known additives such as preservatives and fungicides. Examples of preservatives and fungicides include isothiazoline preservatives such as 2-methyl-4-isothiazolin-3-one and 5-chloro-2-methyl-4-isothiazolin-3-one, paraoxybenzoate esters, and phenoxyethanol.

The polishing composition of the embodiment may be a one-component composition or may be a multi-component composition such as a two-component composition.

The polishing composition of the embodiment may be prepared by diluting a stock solution of the polishing composition, for example, ten-fold or more with a diluent such as water.

The polishing composition of the embodiment may be used in applications other than polishing to form wiring on a semiconductor device.

Next, examples of the invention and comparative examples will be described below.

Polishing compositions for Examples 1 to 3 and Comparative Examples 1 to 8 were prepared by mixing the following ingredients in water: an oxidizing agent, a scratch-reducing agent or an alternative compound thereto, abrasive grains, and a polishing accelerator. Details on the scratch-reducing agent in the polishing compositions of Examples 1 to 3 and the alternative compounds used in place of a scratch-reducing agent in the polishing compositions of Comparative Examples 1 to 8 are shown in the "Scratch-reducing agent or alternative compound" column in Table 1. Although not shown in Table 1, the polishing compositions of Examples 1 to 3 and Comparative Examples 1 to 8 each contained 3.47 g/L of hydrogen peroxide as the oxidizing agent, 4% by mass of colloidal silica having an average primary particle size of 30 nm as the abrasive grains, and 3.78 g/L of isethionic acid as the polishing accelerator. Each of the polishing compositions was used after adjusting the pH value, as measured in a 25° C. environment, to 10 by the addition of potassium hydroxide.

In the first polishing step, the surface of a copper pattern wafer (ATDF 754 mask; thickness of conductor layer composed of copper, 7,000 Å; trench depth, 3,000 Å; thickness of barrier layer composed of tantalum, 100 Å; using silicon dioxide as the insulator layer) was polished with the polishing composition PLANERLITE 7105 (available from Fujimi Incorporated) and under the "First Polishing Conditions" shown in Table 2 until the copper film thickness became 2,500 Å. Next, using the same polishing composition, the surface of the same copper pattern wafer was polished under the "Second Polishing Conditions" shown in Table 3 until the upper surface of the barrier layer was exposed. The size of the steps between the upper surface of the copper wiring and the upper surface of insulating area in a region where copper wiring having a width of 100 μm and insulating areas having a width of 100 μm were alternately arranged on the surface of the copper pattern wafer thus polished was measured and found to be about 450 Å. Provided steps of this size can be obtained, the slurry is not limited to the polishing composition PLANERLITE 7105 available from Fujimi Incorporated; use of an ordinary copper polishing composition is also acceptable.

Next, in the second polishing step, using the respective polishing compositions obtained in Examples 1 to 3 and Comparative Examples 1 to 8, the copper pattern wafer following the first polishing step was polished under the "Third Polishing Conditions" shown in Table 4, thereby removing the portion of the conductor layer and the portion of the barrier layer that were located outside of the trenches and also removing part of the insulator layer.

<Number of Scratches>

The surface of the copper pattern wafer following the second polishing step was measured using a dark field wafer defect inspection system (IS-3200, from Hitachi High-Technologies Corporation) and the coordinate values where surface defects had appeared were determined, following which the surface defects were examined using a defect review SEM (RS-4000, from Hitachi High-Technologies Corporation).

TABLE 1

| | Scratch-reducing agent or alternative compound | | | Size of steps (Å) | Copper polishing rate (Å/min) | Tantalum polishing rate (Å/min) | Silicon dioxide polishing rate (Å/min) |
|---|---|---|---|---|---|---|---|
| | Compound name | Content (mmol/L) | Number of scratches | | | | |
| Ex. 1 | ethylenediamine tetrakismethylenephosphonic acid | 1 | 0 | 440 | 361 | 494 | 378 |
| Ex. 2 | hydroxyphosphonocarboxylic acid | 1 | 12 | 467 | 317 | 492 | 338 |
| Ex. 3 | hydroxyethylidene diphosphonic acid | 1 | 16 | 417 | 309 | 498 | 333 |
| Comp. Ex. 1 | triethylenetetraaminehexaacetic acid | 1 | 31 | 401 | 265 | 488 | 295 |
| Comp. Ex. 2 | ethylenediaminetetraacetic acid | 1 | 35 | 468 | 172 | 491 | 276 |
| Comp. Ex. 3 | trans-cyclohexanediaminetetraacetic acid | 1 | 52 | 335 | 230 | 490 | 290 |
| Comp. Ex. 4 | nitrilotris(methylenephosphonic acid) | 1 | 86 | 445 | 310 | 496 | 318 |
| Comp. Ex. 5 | N-(2-hydroxyethyl)ethylenediamine-N,N',N'-triacetic acid | 1 | 129 | 355 | 238 | 487 | 289 |
| Comp. Ex. 6 | iminodiacetic acid | 1 | 132 | 586 | 368 | 500 | 304 |
| Comp. Ex. 7 | ammonium nitrate | 1 | 182 | 160 | 189 | 486 | 399 |
| Comp. Ex. 8 | ammonium nitrate | 10 | 41 | 534 | 342 | 502 | 305 |

One hundred of the surface defects thus observed were randomly selected and, out of those surface defects, the number classified as scratches were counted. Next, based on this count, the number of scratches per wafer was calculated. The results are shown in the "Number of scratches" column in Table 1. The number of scratches per wafer is preferably 20 or less, more preferably 15 or less, and further preferably 10 or less.

<Size of Steps>

In the region on the surface of the copper pattern wafer following the second polishing step where copper wiring having a width of 100 μm and insulating areas having a width of 100 μm were alternately arranged, using a wide area AFM (WA-1300, from Hitachi Kenki FineTech Co., Ltd.), the size of the steps between the upper surface of the copper wiring and the upper surface of the insulating areas, i.e., the degree to which the level of the upper surface of the copper wiring was low relative to the level of the upper surface of the insulating areas, was measured. The results are shown in the "Size of steps" column in Table 1. The size of the steps is preferably 500 Å or less.

<Copper Polishing Rate>

The copper polishing rate was determined by adding the thickness of the insulator layer removed by polishing in the second polishing step to the above-mentioned step value measured on the copper pattern wafer following the second polishing step, subtracting from this sum the step value (about 450 Å) measured on the copper pattern wafer following the first polishing step, and dividing the difference by the polishing time of 120 seconds in the second polishing step. The results are shown in the "Copper polishing rate" column in Table 1. The insulator layer thickness removed by polishing in the second polishing step was determined by subtracting from the trench depth of 3,000 Å the thickness of the insulator layer on the copper pattern wafer following the second polishing step, as measured with a film thickness gauge (A-SET, from KLA Tencor-Japan, Ltd.).

<Tantalum Polishing Rate>

The tantalum polishing rate was determined by dividing the difference in a tantalum blanket wafer thicknesses, as measured with a sheet resistance measurement system (VR-120 SD/8, from Hitachi Kokusai Electric Inc.), before and after polishing the surface of the tantalum blanket wafer for 60 seconds under the "Third Polishing Conditions" shown in Table 4 with the polishing compositions prepared in Examples 1 to 3 and Comparative Examples 1 to 8, by the polishing time (60 seconds). The results are shown in the "Tantalum polishing rate" column in Table 1.

<Silicon Dioxide Polishing Rate>

The silicon dioxide polishing rate was determined by dividing the thickness of the insulator layer removed by polishing in the second polishing step by the insulator layer polishing time. The results are shown in the "Silicon dioxide polishing rate" column in Table 1. The insulator layer thickness removed by polishing in the second polishing step was determined by subtracting from the trench depth of 3,000 Å the thickness of the insulator layer on the copper pattern wafer following the second polishing step, as measured with a film thickness gauge (A-SET, from KLA Tencor-Japan, Ltd.). The insulator layer polishing time used was the value obtained by subtracting the tantalum clearing time from the polishing time of 120 seconds in the second polishing step. Here, "tantalum clearing time" refers to the time required to remove the barrier layer on the insulator layer, and was determined by dividing the barrier layer thickness of 100 Å by the above-described tantalum polishing rate.

TABLE 2

<First Polishing Conditions>

Polishing machine: Polisher for single-side CMP
(Reflexion LK, from Applied Materials, Inc.)
Polishing pad: Polyurethane foam pad
Polishing pressure: 2.7 psi (=approx. 18.6 kPa)
Rotational speed of surface plate: 90 rpm
Feed rate of polishing composition: 300 mL/min
Rotational speed of carrier: 90 rpm

TABLE 3

<Second Polishing Conditions>

Polishing machine: Polisher for single-side CMP
(Reflexion LK, from Applied Materials, Inc.)
Polishing pad: Polyurethane foam pad
Polishing pressure: 1.5 psi (=approx. 10.3 kPa)
Rotational speed of surface plate: 90 rpm
Feed rate of polishing composition: 300 mL/min
Rotational speed of carrier: 90 rpm

TABLE 4

<Third Polishing Conditions>

Polishing machine: Polisher for single-side CMP
(Reflexion LK, from Applied Materials, Inc.)
Polishing pad: H7000 (Fujibo Ehime Co., Ltd.)
Polishing pressure: 1.5 psi (=approx. 10.3 kPa)
Rotational speed of surface plate: 80 rpm
Feed rate of polishing composition: 300 mL/min
Rotational speed of carrier: 80 rpm
Polishing time: 120 seconds As shown in Table 1, when the polishing compositions of Examples 1 to 3 were used, it was possible to greatly reduce the number of scratches without much of an increase in the size of the steps. In contrast, when the polishing compositions of Comparative Examples 1 to 8 were used, the number of scratches was high.

Steps between the upper surface of the copper wiring and the upper surface of the insulating area generally form on a copper pattern wafer following the first polishing step. The polishing composition used in the second polishing step for the purpose of reducing the size of these steps preferably has a tantalum polishing rate and a silicon dioxide polishing rate that are higher than the copper polishing rate. In the second polishing step, by removing not only the portion of the conductor layer and the portion of the barrier layer that are located outside of the trenches, but also part of the insulator layer, it is possible to reduce scratches on the copper wiring without much of an increase in the size of the steps between the upper surface of the copper wiring and the upper surface of the insulating area.

The invention claimed is:

1. A polishing composition used in polishing a surface of an object to be polished that includes a first portion comprised of copper or a copper alloy and a second portion comprised of tantalum, tantalum nitride, a tantalum alloy, titanium, titanium nitride, a titanium alloy, tungsten, tungsten nitride, or a tungsten alloy, the composition comprising an oxidizing agent and a scratch-reducing agent represented by general formula (1) or (2) below,

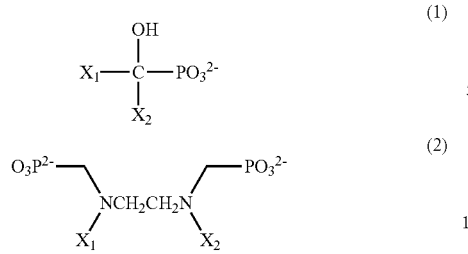

where $X_1$ and $X_2$ are each independently a hydrogen atom, a hydroxyl group, a carboxyl group, an alkyl group, an aryl group, an alkyl polyamine group, an alkyl polycarboxylate group, an alkyl polyaminopolyphosphate group, or an alkyl polyaminopolycarboxylate group, wherein the polishing composition has a polishing rate of the second portion higher than that of the first portion.

2. The polishing composition according to claim 1, wherein the scratch-reducing agent is 2-hydroxy-2-phosphonopropionic acid, hydroxyphosphonocarboxylic acid, ethylenediamine-N,N'-bis(acetic acid)-N,N'-bis(methylene phosphonic acid), or diethylenetriamine tri(methylene phosphonic acid).

3. The polishing composition according to claim 2, wherein the pH value measured in a 25° C. environment is in a range of from 7 to 12.

4. The polishing composition according to claim 2, wherein the pH value measured in a 25° C. environment is in a range of from 9 to 12.

5. The polishing composition according to claim 1, wherein the pH value measured in a 25° C. environment is in a range of from 7 to 12.

6. The polishing composition according to claim 1, wherein the scratch-reducing agent is hydroxyphosphonocarboxylic acid.

7. The polishing composition according to claim 1, wherein the pH value measured in a 25° C. environment is in a range of from 9 to 12.

8. A polishing method comprising:
providing an object to be polished that includes a first portion comprised of copper or a copper alloy and a second portion comprised of tantalum, tantalum nitride, a tantalum alloy, titanium, titanium nitride, a titanium alloy, tungsten, tungsten nitride, or a tungsten alloy; and
polishing a surface of the object with a polishing composition, wherein the polishing composition contains an oxidizing agent and a scratch-reducing agent represented by general formula (1) or (2) below, where X1 and X2 are each independently a hydrogen atom, a hydroxyl group, a carboxyl group, an alkyl group, an aryl group, an alkyl polyamine group, an alkyl polycarboxylate group, an alkyl polyaminopolyphosphate group, or an alkyl polyaminopolycarboxylate group,
wherein by the polishing of a surface of the object with the polishing composition, the second portion is removed more rapidly than the first portion.

9. A method of manufacturing a semiconductor device, comprising:
providing an object to be polished that includes a first portion comprised of copper or a copper alloy and a second portion comprised of tantalum, tantalum nitride, a tantalum alloy, titanium, titanium nitride, a titanium alloy, tungsten, tungsten nitride, or a tungsten alloy; and
polishing a surface of the object with a polishing composition in order to obtain the semiconductor device, wherein the polishing composition contains an oxidizing agent and a scratch-reducing agent represented by general formula (1) or (2) below,

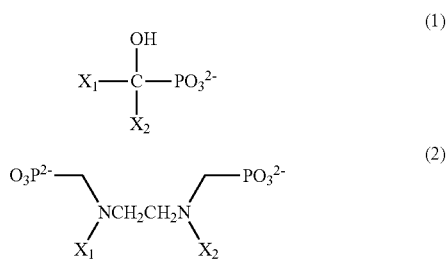

where X1 and X2 are each independently a hydrogen atom, a hydroxyl group, a carboxyl group, an alkyl group, an aryl group, an alkyl polyamine group, an alkyl polycarboxylate group, an alkyl polyaminopolyphosphate group, or an alkyl polyaminopolycarboxylate group,
wherein by the polishing of a surface of the object with the polishing composition, the second portion is removed more rapidly than the first portion.

* * * * *